United States Patent
Gottzein et al.

(10) Patent No.: US 7,413,993 B2
(45) Date of Patent: Aug. 19, 2008

(54) PROCESS FOR REMOVING A RESIDUE FROM A METAL STRUCTURE ON A SEMICONDUCTOR SUBSTRATE

(75) Inventors: Ronald Gottzein, Dresden (DE); Jens Bachmann, Dresden (DE); Dirk Efferenn, Dresden (DE); Uwe Kahler, Dresden (DE); Chung-Hsin Lin, Dresden (DE); Wen-Bin Lin, Dresden (DE); Lee Donohue, Dresden (DE)

(73) Assignees: Infineon Technologies AG, Munich (DE); Nanya Technology Corporation, Taoyuan (TW)

( * ) Notice: Subject to any disclaimer, the term of this patent is extended or adjusted under 35 U.S.C. 154(b) by 47 days.

(21) Appl. No.: 10/995,025

(22) Filed: Nov. 22, 2004

(65) Prior Publication Data
US 2006/0108324 A1    May 25, 2006

(51) Int. Cl.
*H01L 21/302* (2006.01)
(52) U.S. Cl. .............. 438/720; 438/710; 438/714; 134/1.1; 134/1.2
(58) Field of Classification Search ............... 438/706, 438/710, 714, 720, 745; 134/1.1, 1.2, 2
See application file for complete search history.

(56) References Cited

U.S. PATENT DOCUMENTS

| | | | |
|---|---|---|---|
| 5,174,816 A | | 12/1992 | Aoyama et al. |
| 5,545,289 A | * | 8/1996 | Chen et al. .................. 438/694 |
| 6,329,294 B1 | * | 12/2001 | Kim et al. ................... 438/710 |
| 6,399,522 B1 | * | 6/2002 | Tsan et al. .................. 438/788 |
| 6,638,875 B2 | * | 10/2003 | Han et al. ................... 438/725 |
| 6,734,120 B1 | * | 5/2004 | Berry et al. ................. 438/715 |
| 2001/0027030 A1 | * | 10/2001 | Vasudev et al. ............ 438/784 |
| 2002/0072016 A1 | * | 6/2002 | Chen et al. .................. 430/323 |
| 2003/0022473 A1 | * | 1/2003 | Matsumoto et al. ........ 438/514 |
| 2003/0114010 A1 | * | 6/2003 | Jung ........................... 438/707 |

FOREIGN PATENT DOCUMENTS

| | | |
|---|---|---|
| JP | 4-48633 | 2/1992 |
| JP | 8-335571 | 12/1996 |
| JP | 10-289891 | 10/1998 |
| JP | 2001-93805 | 4/2001 |

* cited by examiner

*Primary Examiner*—Lan Vinh
(74) *Attorney, Agent, or Firm*—Slater & Matsil, L.L.P.

(57) ABSTRACT

The invention is concerned with a process for removing residue comprising a polymeric resist and metal oxide from a metal structure on a semiconductor substrate, the process comprising the steps of: (a) heating up the substrate with the metal structure in the presence of molecular nitrogen gas ($N_2$); (b) a stabilization step in the presence of pure molecular nitrogen gas ($N_2$); (c) a passivation step employing a plasma containing at least one of the group of water, nitrogen and oxygen; and (d) a stripping step containing oxygen to remove the residue, comprising resist.

27 Claims, 1 Drawing Sheet

PROCESS FOR REMOVING A RESIDUE FROM A METAL STRUCTURE ON A SEMICONDUCTOR SUBSTRATE

TECHNICAL FIELD

This invention relates to a process for removing a residue from a metal structure on a semiconductor substrate.

BACKGROUND

In semiconductor chips such as DRAM (dynamic random access memory) chips metal structures (e.g., aluminium lines) are used to electrically connect devices on those chips.

The metal structures for semiconductor chips are formed by first depositing the metal with, e.g., a chemical or physical vapor deposition process, on a substrate. Then a polymeric resist material is placed on the metal layer, which is then patterned through lithographic processes.

After the patterning, some of the resist material is removed so that the remaining resist material forms a mask for the following etching of the metal layer. Typical etching chemistries for plasma etching, e.g., for aluminium layers, employ halogen containing etching materials, like $BCl_3$, $BCl_3/Cl_2$ or Br and F-containing gases. In general metal layers are etched by halogen containing plasmas.

After the etching of the metal layer, the remaining residue, containing resist with aluminium oxide, is removed by a dry stripping step usually followed by a wet clean process involving commercial or proprietary solutions. Further the residue can also contain silicon (incorporated from the $SiO_2$ layer below the metal layer) and chlorine (which if of sufficient concentration can initiate corrosion of the amphoteric metal lines). Hence the semiconductor substrate can be further processed.

The processing outlined above is described, e.g., in the book by S. A. Campbell "The Science and Engineering of Microelectronic Fabrication", Oxford University Press, 2001, which is incorporated herein by reference.

One problem of this known processing is that the residue, containing the polymeric resist with complex aluminium oxide, is difficult to remove in the stripping step without damaging the metal lines, especially aluminium lines. Also, at low dimensional technology nodes (e.g. 90 nm or lower) the use of DUV resist is preferred which can lead to increased sidewall residue thicknesses and reduced strip effectivity.

It is known, e.g., from U.S. Pat. No. 5,545,289 ('289 patent) to strip the polymeric resist and other residues with a plasma containing oxygen and an oxygen activating gas such as $CF_4$ or $N_2$. But as is mentioned in the prior art document, those steps are sometimes ineffective. A passivation step is used to reduce post-etch corrosion problems in the metal lines. The solution described in the '289 patent utilizes a multicycle process of the stripping and passivation steps to improve the removal of the polymeric resist. This makes the process more complex. The '289 patent is incorporated herein by reference.

Furthermore, experience has shown that such known methods are ineffective when the residue has a high metal oxide concentration, e.g., a high aluminium oxide concentration.

SUMMARY OF THE INVENTION

The process of embodiments of the present invention achieves the removal of the residue comprising polymeric resist and complex metal oxide through a special pre-treatment of the substrate with the metal structure and the polymeric remaining attached to it.

The pre-treatment comprises two process steps: a special heat up step a); and a special stabilization step b). According to the preferred embodiment of the invention, the heating up of the substrate with the metal structure and the stabilisation step take place in the presence of nitrogen gas following metal etch and without bringing the substrate to normal atmospheric conditions.

These steps are then followed by a passivation step c) employing a plasma containing at least one of the group of water, nitrogen and oxygen, and stripping step d) to prevent corrosion and to remove the residue, comprising resist.

It has been found that the in situ pre-treatment in the heating up step and the stabilization step under nitrogen gas allows for a complete and corrosion-free removal of the residue in the following wet strip step. This may be due to suppression of oxidation processes through the presence of a reducing gas and/or possibly through surface reaction/micro-diffusion processes. This allows modification of the residue such that conventional wet strip becomes totally effective.

The pre-treatment steps (heating up step a), stabilization step b)) can be conducted under pure nitrogen atmosphere or with a mixture containing nitrogen gas and oxygen gas.

A temperature range for all process steps is 20 to 400° C., preferably at a temperature of 280° C.

The heating up process step a) is conducted for a time longer than 2 seconds, preferably for 15 seconds. Whereas stabilization step b) is conducted for a duration between 1 and 20 seconds, preferably for 5 seconds.

The heating up step a) and the stabilization step b) are conducted with a volumetric flow rate greater than 10 sccm nitrogen gas ($N_2$), preferably with a volumetric flow rate of 1000 sccm nitrogen gas ($N_2$).

The total gas pressure in the heating up step a) and the stabilization step b) is 1 Torr, preferably in the range from 0.2 to 10 Torr.

Both the passivation step c) and the stripping step d) comprise a plasma etch process, especially a downstream TCP (ICP) process operating at 13,56 MHz. The stripping step d) can also comprise a plasma-etch process, involving $CF_4$ as agent. Furthermore, the stripping process can also comprise the application of a microwave plasma generation process, the microwave radiation usually having a frequency in the Gigahertz (e.g., 2.45 GHz) range.

BRIEF DESCRIPTION OF THE DRAWINGS

These and other features of the present invention will be further described from the following drawings, description and appended claims, where:

DETAILED DESCRIPTION OF ILLUSTRATIVE EMBODIMENTS

Figure 1:
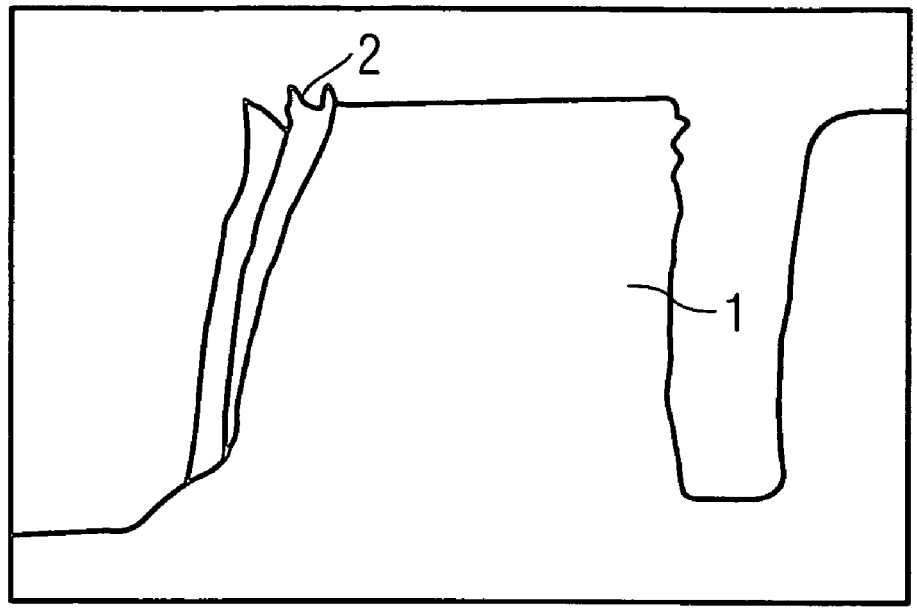
FIG. 1 is taken from a SEM image depicting a cross-section of an aluminium line with residue remaining after a stripping process according to the prior art.

FIG. 1 shows a cross-section of an aluminium line 1 on an integrated circuit chip. In one example, the chip is a DRAM chip, although it is understood that other IC's can utilize concepts of the invention. The aluminium line 1 electrically connects different devices on the chip, not depicted here.

Around the aluminium line 1 some residue 2 is visible. It is especially noteworthy that the residue 2 extends above the top level of the aluminium line 1 forming peaks.

The depicted situation shows the metal line 1 and the residue 2 after a passivation and stripping step for a resist, the stripping process comprising first a plasma etch and then a wet etch step. As can be seen from FIG. 1, residue comprising polymeric resist could not be removed through the wet-etch step known from prior art. The complicating fact is that the residue 2 contains metal oxide, here primarily aluminium oxide, which makes it difficult to remove the residue 2 without damaging the aluminium line 1.

Figure 2:
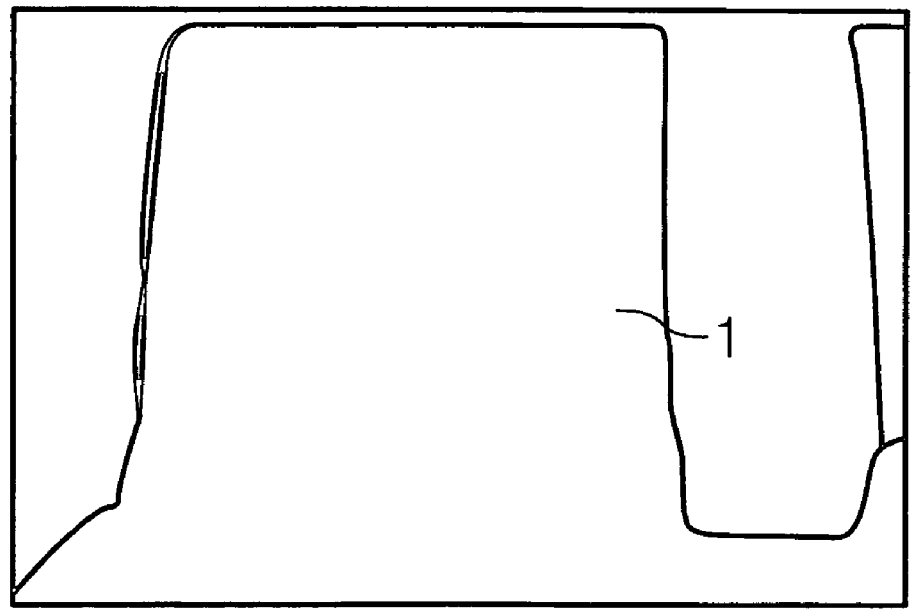
FIG. 2 is taken from a SEM image depicting a cross-section of an aluminium line after a stripping process according to an embodiment of the present invention.

FIG. 2 in contrast shows the result achieved by using an embodiment of the present invention. The present invention introduces a pre-treatment of the substrate with the metal line, here an aluminium line, i.e., a heating up step and a stabilization step. In both steps it is important that the process steps are conducted in the presence of nitrogen gas, either pure nitrogen gas or a mixture of nitrogen and oxygen gases. The other process steps (passivation, stripping) were left unchanged.

The process conditions for the heating up step are:

| | |
|---|---|
| Pressure | 1 Torr |
| Volumetric flow rate nitrogen gas | 1000 sccm (pure nitrogen) |
| Duration | 15 seconds |
| Position of substrate | Wafer pins down |

The process conditions for the stabilization step are:

| | |
|---|---|
| Pressure | 1 Torr |
| Volumetric flow rate nitrogen gas | 1000 sccm (pure nitrogen) |
| Duration | 5 seconds |
| Position of substrate | Wafer pins down |

After this a passivation in a plasma chamber in the presence of water vapor is conducted with the following parameters:

| | |
|---|---|
| Pressure | 1 Torr |
| Power | 1500 W |
| Volumetric flow rate nitrogen gas | 500 sccm |
| Volumetric flow rate water vapor | 2800 sccm |
| Duration | 45 seconds |
| Position of substrate | Wafer pins down |

The plasma chamber as such is known in the prior art, e.g., from the above-cited documents.

The final removal of the resist is achieved in a stripping process comprising a plasma etch with the following parameters:

| | |
|---|---|
| Pressure | 1 Torr |
| Power | 2400 W |
| Volumetric flow rate oxygen gas | 4000 sccm |
| Volumetric flow rate nitrogen | 280 sccm |
| Duration | 90 seconds |
| Position of substrate | Wafer pins down |
| Wafer temperature for all process steps | typically 280° C. |

This is followed by a wet-etch step also known from the prior art, which can use variety commercially or proprietary available solutions, e.g., EKC or DSP.

As can be seen, the result of the two pre-treatment steps, the heating up and the stabilization is much better removal of the residue.

What is claimed is:

1. A process for removing residue comprising a polymeric resist and metal oxide from a metal structure on a semiconductor substrate, the process comprising a pre-treatment of the substrate with the residue, the pre-treatment including the steps of:
   (a) heating up the substrate with the metal structure and the residue in the presence of molecular nitrogen gas without the presence of a plasma;
   (b) performing a stabilization step in the presence of only molecular nitrogen gas without the presence of a plasma, the pre-treatment being followed by;
   (c) performing a passivation step employing a plasma containing at least one material selected from the group consisting of water, nitrogen and oxygen; and
   (d) performing a stripping step containing oxygen to remove the residue, wherein step (b) is performed before steps (c) and (d).

2. The process according to claim 1, wherein process step d) is followed by a vacuum-plasma modification of the residue and an exsitu solution clean step to remove any remaining residue.

3. The process according to claim 1, wherein the heating up step a) is conducted in the presence of pure nitrogen gas.

4. The process according to claim 1, wherein the heating up step a) is conducted in the presence of a mixture of nitrogen gas and oxygen gas.

5. The process according to claim 1, wherein the stabilization step b) is conducted in the presence of pure nitrogen gas.

6. The process according to claim 1, wherein the stabilization step b) is conducted in the presence of a mixture of nitrogen gas and oxygen gas.

7. The process according to claim 1, wherein at least one of the process steps is conducted in a temperature range of 20 to 400° C.

8. The process according to claim 1, wherein the heating up step a) is conducted for a time longer than 2 seconds.

9. The process according to claim 8, wherein the heating up step a) is conducted for a time longer than 15 seconds.

10. The process according to claim 1, wherein the stabilization step b) is conducted for a duration between 1 and 20 seconds.

11. The process according to claim 1, wherein the heating up step a) is conducted with a volumetric flow rate of greater than 10 sccm nitrogen gas.

12. A process for removing residue comprising a polymeric resist and metal oxide from a metal structure on a semiconductor substrate, the process comprising the steps of:
   (a) heating up the substrate with the metal structure in the presence of molecular nitrogen gas without the presence of a plasma, wherein the heating up step a) is conducted with a volumetric flow rate of greater than 1000 sccm nitrogen gas;
   (b) performing a stabilization step in the presence of only molecular nitrogen gas without the presence of a plasma;
   (c) performing a passivation step employing a plasma containing at least one material selected from the group consisting of water, nitrogen and oxygen; and
   (d) performing a stripping step containing oxygen to remove the residue, wherein step (b) is performed before steps (c) and (d).

13. The process according to claim 1, wherein the stabilization step b) is conducted with a volumetric flow rate of greater than 10 sccm nitrogen gas.

14. A process for removing residue comprising a polymeric resist and metal oxide from a metal structure on a semiconductor substrate, the process comprising the steps of:
 (a) heating up the substrate with the metal structure in the presence of molecular nitrogen gas without the presence of a plasma;
 (b) performing a stabilization step in the presence of only molecular nitrogen gas without the presence of a plasma, wherein the stabilization step b) is conducted with a volumetric flow rate of greater than 1000 sccm nitrogen gas;
 (c) performing a passivation step employing a plasma containing at least one material selected from the group consisting of water, nitrogen and oxygen; and
 (d) performing a stripping step containing oxygen to remove the residue, wherein step (b) is performed before steps (c) and (d).

15. The process according to claim 1, wherein the total gas pressure in the heat up step a) and the stabilization step is in the range from 0.2 to 10 Torr.

16. The process according to claim 1, wherein the stripping process comprises a plasma etch process.

17. The process according to claim 13, wherein the plasma etching is a TCP (ICP) process operating at 13.56 MHz.

18. The process according to claim 1, wherein the stripping step comprises a plasma process.

19. The process according to claim 18, wherein the stripping step uses $CF_4$ as agent.

20. The process according to claim 1, wherein the stripping process comprises the application of a microwave process, the microwave radiation having a frequency in the Gigahertz range.

21. The process according to claim 1, wherein the process is used in the production of a semiconductor device using lithography technology with exposure wavelengths selected from the group of 193 and 248 nm and provides metal structures for a dimensional technology node of 170 nm or less.

22. The process according to claim 21, wherein the dimensional technology node is less than 110 nm.

23. The process according to claim 1, wherein the metal structure comprises aluminum or aluminum-copper alloy.

24. The process according to claim 1, wherein the residue comprises a compound based on aluminum oxide.

25. The process according to claim 24, wherein the residue includes at least one of Si, C, F and Br.

26. The process according to claim 1, and further comprising performing a cleaning step using a wet solution after the stripping step.

27. The process according to claim 1, wherein the pretreatment is performed in the presence of pure nitrogen.

* * * * *